United States Patent [19]

Pedersen

[11] Patent Number: 5,220,214
[45] Date of Patent: Jun. 15, 1993

[54] REGISTERED LOGIC MACROCELL WITH PRODUCT TERM ALLOCATION AND ADJACENT PRODUCT TERM STEALING

[75] Inventor: Bruce B. Pedersen, Santa Clara, Calif.

[73] Assignee: Altera Corporation, San Jose, Calif.

[21] Appl. No.: 879,908

[22] Filed: May 8, 1992

Related U.S. Application Data

[63] Continuation of Ser. No. 688,252, Apr. 22, 1991, Pat. No. 5,121,006.

[51] Int. Cl.$^5$ ........................................... H03K 19/177
[52] U.S. Cl. .................................... 307/465; 307/469
[58] Field of Search ................. 307/465, 469; 364/716

[56] References Cited

U.S. PATENT DOCUMENTS

| | | | |
|---|---|---|---|
| 4,758,746 | 7/1988 | Birkner et al. | 307/465 |
| 4,864,161 | 9/1989 | Norman et al. | 307/272.2 |
| 4,871,930 | 10/1989 | Wong et al. | 307/465 |
| 4,879,481 | 11/1989 | Pathak et al. | 307/468 X |
| 4,903,223 | 2/1990 | Norman et al. | 364/716 |
| 4,912,345 | 3/1990 | Steele et al. | 307/465 |
| 4,918,641 | 4/1990 | Jigour et al. | 307/465 X |
| 4,983,959 | 1/1991 | Breuninger | 307/465 X |
| 5,003,202 | 3/1991 | Keida | 307/469 X |
| 5,023,484 | 6/1991 | Pathak et al. | 307/465 |
| 5,023,606 | 6/1991 | Kaplinsky | 307/465 X |
| 5,027,011 | 6/1991 | Steele | 307/465 |
| 5,053,646 | 10/1991 | Higuchi et al. | 307/465 |
| 5,121,006 | 6/1992 | Pedersen | 307/465 |

OTHER PUBLICATIONS

Altera Max EPLD Family Architecture data sheet, Altera Corporation, Jan. 1990, pp. 1-5.
Advanced Micro Devices MACH 1 and MACH 2 Families data sheet, Advanced Micro Devices, Inc., Apr. 1991, pp. 1-7, 14, 15, 28, 29.
Plus Logic FPGA2020 data sheet, Plus Logic, Inc., date unknown, pp. 1-7.

*Primary Examiner*—David R. Hudspeth
*Attorney, Agent, or Firm*—Jeffrey H. Ingerman

[57] ABSTRACT

A macrocell with product term allocation and adjacent product term stealing is disclosed. Programmable configuration switches provide product term allocation by directing input product terms to an OR gate or to the secondary inputs to a register. Adjacent product term stealing is accomplished by providing the output of the OR gate of each macrocell as an input to the OR gate of an adjacent macrocell. By using the output of the OR gate of the first macrocell, the adjacent macrocell steals the product terms and the OR gate of the first macrocell for use in its own OR gate. An arbitrarily wide OR function can be implemented by daisy chaining the OR gates of adjacent macrocells. Because programmable configuration switches can direct individual input product terms to the register logic instead of the OR gate, the register logic can be used even when an adjacent macrocell steals the OR gate.

16 Claims, 1 Drawing Sheet

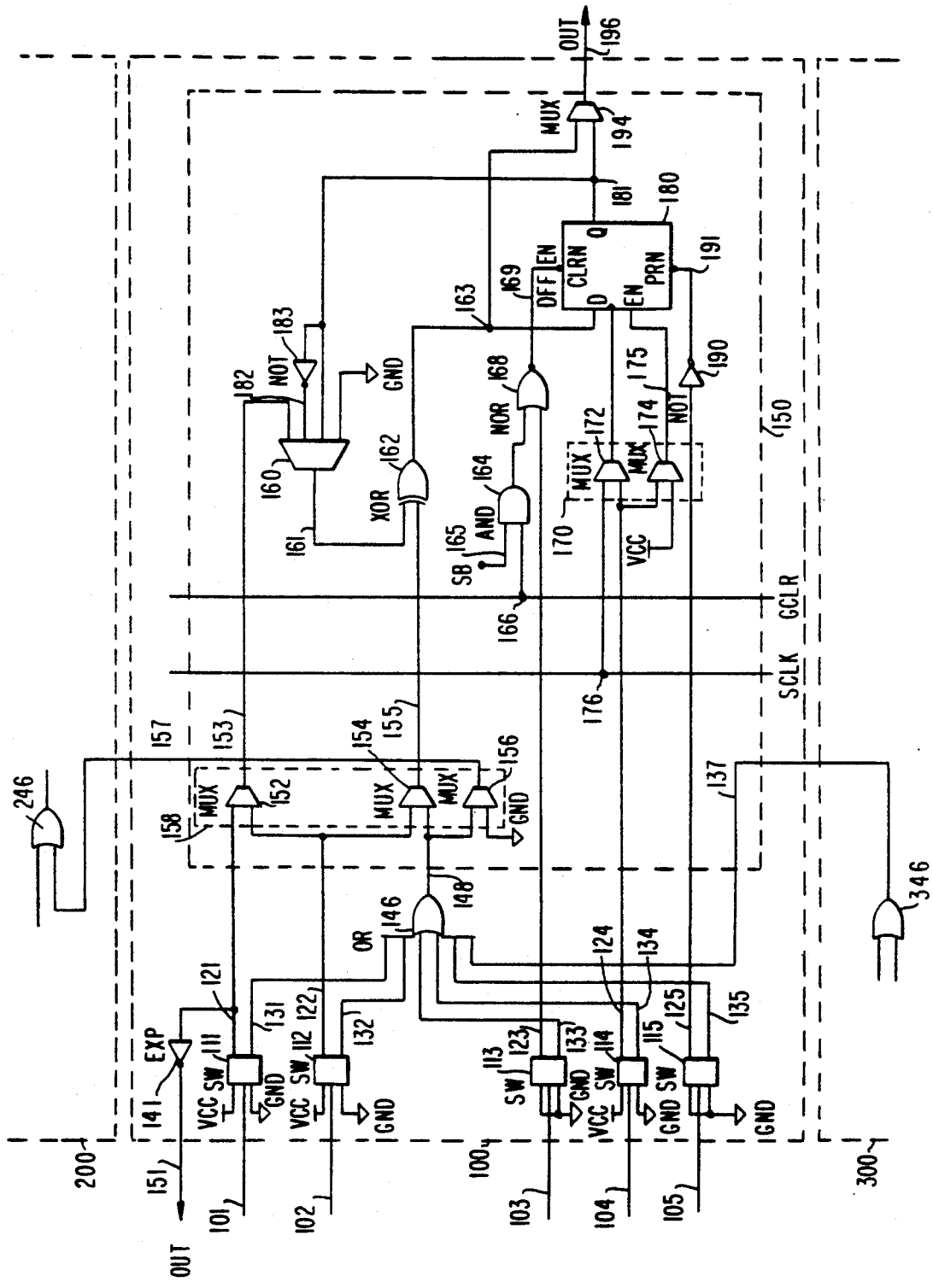

REGISTERED LOGIC MACROCELL WITH PRODUCT TERM ALLOCATION AND ADJACENT PRODUCT TERM STEALING

CROSS REFERENCE TO RELATED APPLICATION

This is a continuation of application Ser. No. 07/688,252 filed Apr. 22, 1991, now U.S. Pat. No. 5,121,006.

BACKGROUND OF THE INVENTION

This invention relates to user programmable logic devices. More particularly, the invention relates to a macrocell in which product terms can be allocated between an OR gate and registered logic, and in which product terms can be summed together with product terms from an adjacent macrocell.

User programmable logic devices provide flexibility in digital logic design by allowing a designer to implement logic functions through a sum-of-products architecture typically composed of an array of AND gates connected to an array of OR gates. The outputs from the AND gates are referred to as product terms. The output of each OR gate provides the sum of the input product terms.

Typically, a macrocell receives a number of product terms as inputs. Some of the product terms are input to the OR gate. The output of the OR gate then is typically fed to a register which stores the result. Some devices feature additional combinatorial logic associated with the register (registered logic). This logic typically allows inputs to the register to be inverted or combined with the output of the register or with the product terms not used by the OR gate.

In a typical macrocell, the number of product terms that can be ORed together is limited to the number of product terms that are input to the macrocell. Another type of conventional macrocell has the ability to share its OR function with a second macrocell, but in such a macrocell use of the OR function by the second macrocell precludes use of the remaining logic in the macrocell. Also, in a conventional macrocell having the ability to steer product terms to either an OR gate or to registered logic, use of the OR function must be sacrificed when product terms are steered to the registered logic.

In view of the foregoing, it is an object of this invention to provide a macrocell which supports summing of an arbitrary number of product terms by daisy chaining the OR gates of an arbitrary number of macrocells. It is a further object of this invention to provide a macrocell in which use of its OR function by another macrocell does not prevent the use of the remaining logic elements of the macrocell. It is another object of this invention to provide a macrocell in which product terms may be steered to the register logic without sacrificing use of the OR function.

SUMMARY OF THE INVENTION

This invention provides a macrocell with product term allocation and adjacent product term stealing. Programmable configuration switches provide product term allocation by directing input product terms to an OR gate or to the secondary inputs to a register. Adjacent product term stealing is accomplished by providing the output of the OR gate of each macrocell as an input to the OR gate of an adjacent macrocell. By using the output of the OR gate of the first macrocell, the adjacent macrocell steals the product terms input to the OR gate of the first macrocell for use in its own OR gate. An arbitrarily wide OR function can be implemented by daisy chaining the OR gates of adjacent macrocells. By the process of adjacent product term stealing, product terms are allocated between macrocells. Because the programmable configuration switches can direct individual input product terms to the secondary inputs to the register instead of the OR gate, the register and register accompanying logic can be used even when an adjacent macrocell steals the OR gate. The register and register accompanying logic provide output control for the macrocell. In one preferred embodiment, an EXCLUSIVE-OR gate with a plurality of selectable inputs allows the register to be implemented as a D or a T flip-flop.

BRIEF DESCRIPTION OF THE DRAWINGS

The above and other objects and advantages of the invention will be apparent on consideration of the following detailed description, taken in conjunction with the accompanying FIGURE, which is a schematic diagram of an illustrative embodiment of the invention.

DETAILED DESCRIPTION OF THE INVENTION

A preferred embodiment of the invention, illustrated in the FIGURE, has five product terms 101-105 as inputs to macrocell 100. Each of product terms 101-105 is coupled to a respective one of programmable switches 111-115. A static architecture bit corresponds to each programmable switch 111-115. Based on the state of its static architecture bit, each of programmable switches 111-115 selects as outputs two of its three inputs. A static architecture bit can be implemented conventionally by storing charge in a floating gate memory cell or by blowing a fuse.

Using programmable switch 111 as an example, if its static architecture bit is HIGH, product term 101 appears at output 121 and a static LOW appears at output 131. If its static architecture bit is LOW, a static HIGH appears on output 121 and product term 101 appears on output 131. Programmable switches 112 and 114 perform in the same manner. For programmable switches 113 and 115 a static LOW output replaces the static HIGH output, because these switches have a second input connected to ground in place of an input connected to $V_{cc}$.

Each product term 101-105 can be configured by means of the programmable switches 111-115 to act as an input either to OR gate 146 or to an alternate destination within register means 150. The alternate destinations for product terms 101 and 102 are the secondary inputs to XOR gate 162. The alternate destination for product term 101 also includes external output 151 via invertor 141. The alternate destinations for product terms 103-105 are the secondary inputs to register 180.

OR gate 146 receives inputs 131-135 from programmable switches 111-115 and from input 137. Input 137 represents an input received from a first adjacent macrocell 300. First adjacent macrocell 300 may or may not be the same as macrocell 100, but it must contain an OR gate 346 for summing product terms.

Inputs 131-135 each provide either a product term or a static LOW signal depending on the states of the static architecture bits controlling the programmable switches 111-115. Thus, OR gate 146 performs an OR function on a selected group of product terms and provides the sum of those product terms as an output.

Multiplexer 156 provides a mechanism for selecting either the output of OR gate 146 or a static LOW to serve as external output 157. Output 157 is input to the OR gate of a second adjacent macrocell 200 in the same manner that input 137 is an input to OR gate 146. Macrocell 200 may or may not be the same as macrocell 100, but it must include an OR gate 246 for summing input product terms. By selecting the output of OR gate 146 to serve as external output 157, an arbitrarily wide OR function can be implemented across a series of adjacent macrocells. The process of linking the OR gates across a series of macrocells is known as daisy chaining. In the illustrative embodiment OR gate 146 has six inputs; therefore, by daisy chaining two adjacent macrocells, an eleven input OR function can be implemented.

The process by which product terms are directed to alternate destinations depending on the states of static architecture bits is called product term steering. Because macrocells are commonly used to implement a sum-of-products architecture, it is often desirable to daisy chain OR gates to obtain the sum of a large number of product terms. Sometimes not all the product terms in a macrocell are utilized in the OR function. By steering unused product terms to the input to XOR gate 162 or to the secondary inputs to register 180, these unused product terms can still implement useful logic.

Generally, the logic associated with XOR gate 162 and register 180 will be used to direct the output of OR gate 146 to external output 196. Therefore, the principle advantage to product term steering arises when OR gate 146 is daisy chained to an adjacent macrocell, because this is when the logic associated with XOR gate 162 and register 180 is typically unused.

When a macrocell receives an input from the OR gate of an adjacent macrocell, it utilizes the product terms directed to that OR gate. Using product terms from an adjacent macrocell can be referred to as adjacent product term stealing. Allocating some of a macrocell's product terms to an OR gate and the remaining product terms to registered logic can be referred to as product term allocation.

When not daisy chained to an adjacent macrocell via output 157, the output of OR gate 146 serves as an input to multiplexer 154. The output of multiplexer 154 serves as an input to XOR 162. A static architecture bit determines whether multiplexer 154 selects the output of OR gate 146 or the output of programmable switch 112 as its output. The output of programmable switch 112 is either product term 102 or a static HIGH signal, depending on the state of the static architecture bit corresponding to programmable switch 112. Therefore, the output of multiplexer 154 is a static HIGH, product term 102 or the output of OR gate 146 depending on the states of two static architecture bits. In the present embodiment, multiplexer 152, multiplexer 154 and multiplexer 156 are all controlled by a single static architecture bit, although in alternate embodiments each could be controlled separately. By controlling three elements with one bit, product term 102 can be routed through multiplexer 152 or through multiplexer 154, but not through both. Likewise, the output of OR gate 146 can be routed through multiplexer 154 or multiplexer 156 but not both.

Multiplexer 152 selects between output 122 of switch 112 or output 121 of switch 111. Therefore, the output of multiplexer 152 is product term 101, product term 102 or a static HIGH. Output 121 also serves as an input to Invertor 141 which drives an external output signal 151.

Output 151 can be used to implement logic that requires only a one product term macrocell, or it can be used as an expander to augment the logic capabilities of other macrocells as described in the aforementioned patents. Expanders are described, for example, in commonly-assigned U.S. Pat. Nos. 4,864,161, 4,871,930 and 4,903,223, and are product terms that do not feed a fixed device. Instead, they can be combined to yield more complex logic functions than can be obtained using the product terms that feed fixed devices. It has been found that dedicated expander product terms of the type described in one or more of the aforementioned patents were useful, but frequently were underutilized. The present invention allows product term 101 to be used as an expander, but also to be used as an input to OR gate 146 or exclusive-OR gate 162 depending on the programming of switch 111 and multiplexers 152, 160.

Specifically, the registered logic macrocell described herein has two outputs—the primary output 196, and the "expander" output 151. Primary output 196 is fed by either the output of register 180 or the output of exclusive-OR gate 162. Output 151 is fed by one of the product terms of the macrocell through switch 111.

XOR gate 162 receives inputs from multiplexer 154 and multiplexer 160. Multiplexer 160 selects as its output one of four inputs based on the states of two static architecture bits. Multiplexer 160 selects from among the output of register 180, the inverse of the output of register 180, a static LOW, and an input from multiplexer 152 which is product term 101, product term 102 or a static HIGH. Product term 102, a static HIGH or the output of OR gate 146 is input to XOR gate 162 via multiplexer 154. By properly selecting the inputs to XOR gate 162, register 180 can be used to implement D or T flip-flops with inversion control on the D or T inputs.

The output of XOR gate 162 feeds the D input of register 180 and an input to multiplexer 194. The output of register 180 provides the second input to multiplexer 194. The state of static architecture bit determines which input multiplexer 194 selects to be external output 196.

Register 180 receives CLOCK, ENABLE, PRESET and asynchronous CLEAR inputs. NOR gate 168 provides the CLEAR input 169 for register 180. The first input to NOR gate 168 comes from programmable switch 113, which provides either product term 103 or a static LOW as input. AND gate 164 provides the other input to NOR gate 168. A global CLEAR signal, GCLR, for use in conjunction with all the macrocells in a device, provides a first input to AND gate 164. The global CLEAR function can be programmatically disabled by static architecture bit SB which provides the second input 165 to AND gate 164.

Product term 105, selected by programmable switch 115 and inverted by invertor 190 provides the PRESET input 191 to register 180. Therefore, the PRESET input 191 can be programmably disabled via the static architecture bit that controls programmable switch 115.

Multiplexer 172 and multiplexer 174, which are controlled in this embodiment by a single static architecture bit provide the CLOCK and ENABLE inputs 173, 175 respectively, to register 180. The CLOCK input derives either from a global clock signal SCLK 176 common to all macrocells within a device or from product term 104 via programmable switch 114. Product term 104 is also input to multiplexer 174, but is connected in this embodiment such that depending on the state of the static architecture bit controlling multiplexers 172 and 174, product term 104 is passed through only one of the multiplexers 172, 174. The second input to multiplexer 174 is a static HIGH. Therefore, product term 104 serves either as a CLOCK signal via multiplexer 172 or as a synchronous clock ENABLE signal via multiplexer 174 in conjunction with the global clock signal SCLK 176. Thus in the present embodiment, product term 104 provides either a clock signal via multiplexer 172 with a static HIGH serving as ENABLE via multiplexer 174, or a global clock signal SCLK 176 serves as CLOCK with product term 104 acting as a synchronous clock ENABLE via multiplexer 174.

It will be understood that the foregoing is merely illustrative of the principles of this invention, and that various modifications can be made by those skilled in the art without departing from the scope and spirit of the invention.

What is claimed is:

1. A macrocell comprising:
   an OR gate;
   means for coupling an external signal to a first input to the OR gate;
   a register means;
   means for receiving a product term;
   means having two programmable states for coupling the product term (a) to a second input to the OR gate when in a first programmable state and (b) to the register means when in a second programmable state, and for additionally coupling said product term to an alternate output of said macrocell when in a predetermined one of said first and second programmable states, said alternate output thereby functioning as an expander; and
   means for programmably coupling the output of the OR gate to the input to an OR gate in a second macrocell.

2. The macrocell of claim 1, wherein the register means includes a D flip-flop.

3. The macrocell of claim 1, wherein the register means includes a T flip-flop.

4. The macrocell of claim 1, wherein the register means includes:
   a first multiplexer having a product term as a first input and a sum of product terms as a second input;
   a second multiplexer having a product term as a first input, a static LOW as a second input, the output of the register as a third input, and the inverted output of the register as a fourth input; and
   an EXCLUSIVE-OR gate having a first input from the output of said first multiplexer and a second input from the output of said second multiplexer, and having its output coupled to the input to the register.

5. The macrocell of claim 1, wherein the register means includes a multiplexer for selecting between a product term or an external clock signal for driving a clock input to the register.

6. The macrocell of claim 1, wherein the means includes means for using a product term to enable the register.

7. The macrocell of claim 1, wherein the register means includes means for using a product term for presetting the register.

8. The macrocell of claim 1, wherein the register means includes means for using a product term to clear the register.

9. The macrocell of claim 1, wherein the means for programmably coupling the output of the OR gate to the input to an OR gate in a second macrocell includes a static architecture bit.

10. The macrocell of claim 1, wherein the means having two programmable states for coupling the product term to a second input to the OR gate when in a first programmable state and (b) the register means when in a second programmable state, and to said alternate output when in a predetermined one of said first and second programmable states, includes a static architecture bit.

11. The macrocell of claim 1, wherein the register means includes a multiplexer for selecting between the output of the register and the output of the OR gate as an external output from the macrocell.

12. The macrocell of claim 1 wherein said means having two programmable states couples said product term to both said OR gate and said alternate output when in said first programmable state, and to said register means when in said second programmable state.

13. The macrocell of claim 1 wherein said means having two programmable states couples said product term to said OR gate when in said first programmable state, and to both said register means and said alternate output when in said second programmable state.

14. A programmable logic device comprising:
   a first macrocell having an OR gate for summing product terms, a register means and means for receiving a product term;
   a second macrocell having an OR gate for summing product terms;
   a first static architecture bit having first and second programmable states;
   a second static architecture bit having first and second programmable states;
   means for coupling the output of the OR gate of the first macrocell to an input of the OR gate of the second macrocell when the first static architecture bit is in its first programmable state and for coupling the output of the OR gate of the first macrocell to an input to the register means of the first macrocell when the first static architecture bit is in its second programmable state; and
   means for coupling the product term to the OR gate of the first macrocell when the second static architecture bit is in its first programmable state and to the register means of the first macrocell when the second static architecture bit is in its second programmable state, and for additionally coupling said product term to an alternate output when said second static architecture bit is in a predetermined one of said first and second programmable states, said alternate output thereby functioning as an expander.

15. The programmable logic device of claim 14 wherein said means for coupling the product term couples said product term to both said OR gate of the first macrocell and to said alternate output when said second static architecture bit is in said first programmable state, and to said register means of the first macrocell when said second static architecture bit is in said second programmable state.

16. The programmable logic device of claim 14 wherein said means for coupling said product term couples said product term to said OR gate of the first macrocell when said second static architecture bit is in said first programmable state, and to both said register means of the first macrocell and said alternate output when said second static architecture bit is in said second programmable state.

* * * * *

UNITED STATES PATENT AND TRADEMARK OFFICE
CERTIFICATE OF CORRECTION

PATENT NO.   : 5,220,214
DATED        : June 15, 1993
INVENTOR(S)  : Bruce B. Pedersen It is certified that error appears in the above-identified patent and that said Letters Patent is hereby corrected as shown below:

Claim 6, line 1: Before "means" insert --register--.

Signed and Sealed this

Twenty-ninth Day of May, 2001

Attest:

NICHOLAS P. GODICI

*Attesting Officer*   Acting Director of the United States Patent and Trademark Office